United States Patent
Kouichi

(10) Patent No.: US 6,862,204 B2
(45) Date of Patent: Mar. 1, 2005

(54) SEMICONDUCTOR INTEGRATED CIRCUIT HAVING CONNECTING WIRES FOR INTERCONNECTING BIT LINES

(75) Inventor: Noro Kouichi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/277,150

(22) Filed: Oct. 22, 2002

(65) Prior Publication Data

US 2003/0161174 A1 Aug. 28, 2003

(30) Foreign Application Priority Data

Feb. 25, 2002 (JP) ........................................ 2002-047956

(51) Int. Cl.$^7$ ................................................ G11C 5/06
(52) U.S. Cl. ..................... 365/63; 365/145; 365/149; 365/65; 365/69
(58) Field of Search ............................ 365/63, 65, 69, 365/145, 149

(56) References Cited

U.S. PATENT DOCUMENTS 5,870,343 A * 2/1999 Chi et al. .................. 365/203
6,201,272 B1   3/2001 Kotecki et al. ............. 257/296
6,600,674 B2 * 7/2003 Kasai ........................ 365/145

OTHER PUBLICATIONS

European Search Report dated Mar. 23, 2004.

* cited by examiner

*Primary Examiner*—Son Mai
(74) *Attorney, Agent, or Firm*—Arent Fox, PLLC

(57) ABSTRACT

A plurality of memory cell arrays includes bit lines and memory cells each constituted by a variable capacitor, and operates at mutually different timings. The bit lines of each memory cell array are connected to bit lines of the other memory cell arrays via connecting wires. Accordingly, the actual capacitances of the bit lines are the capacitances of bit lines of that memory cell array itself plus that of the other memory cell arrays plus the capacitances of the connecting wires. Therefore, when data is read from the memory cells, the variations in voltage of the bit lines caused by the capacitive division can be enlarged. Consequently, the read margin can be prevented from being degraded, and the manufacturing yield of semiconductor memories can be prevented from being degraded. Additionally, since the variations in voltage of the bit lines are enlarged, the data reading time can be shortened.

22 Claims, 18 Drawing Sheets

SEMICONDUCTOR INTEGRATED CIRCUIT HAVING CONNECTING WIRES FOR INTERCONNECTING BIT LINES

BACKGROUND OF THE INVENTION

1. Field of the Invention

The present invention relates to a technique for reading data reliably from a semiconductor memory having memory cells each constituted by a variable capacitor.

2. Description of the Related Art

Recently, there have been developed ferroelectric memories as semiconductor memories having both high-speed performance of DRAMs and nonvolatility of Flash memories and EEPROMs. The memory cells of a ferroelectric memory each has, for example, a ferroelectric capacitor and a transfer transistor connecting an end of the ferroelectric capacitor to a bit line. The other end of the ferroelectric capacitor is connected to a plate line. The ferroelectric memory, even when power is removed therefrom, can retain data by causing the ferroelectric capacitors to act as variable capacitors and utilizing the fact that even when the voltages applied to the ferroelectric capacitors become zero, the residual dielectric polarizations remain therein.

A read operation of the ferroelectric memory is executed by turning on transfer transistors to connect the associated memory cells to the respective bit lines and then causing the level of the associated plate line to vary to be a high level for a predetermined time period. The bit lines are precharged to a ground voltage before the read operation. The variation in level of the plate line causes the polarization charges of the ferroelectric capacitors to vary. The charges occurring due to this variation of the polarization charges are redistributed by the capacitances of the bit lines and the capacitances of the ferroelectric capacitors (effect of capacitive division). Then, the voltage differences between a reference voltage and the bit line voltages which have varied due to the read operation are amplified by a sense amplifier S/A, whereby data is read out.

As described above, the ferroelectric memory performs a data reading operation by utilizing the capacitive division of the ferroelectric capacitors and bit line capacitances. The capacitances of the ferroelectric capacitors are much larger than those of the capacitors formed in the memory cells of DRAMs. For this reason, if the lengths of the bit lines are short and the capacitances of the bit lines are small, then the variations in voltage of the bit lines caused by the capacitive division are small. Accordingly, the voltage differences between the bit line voltages and the reference voltage are small, so that the read margin in the sense amplifier is small. Besides, if the voltage differences between the bit line voltages and the reference voltage are small, the amplification time in the sense amplifier is long, resulting in a long read cycle.

Recently, ferroelectric memories of small capacity have been demand for authentication of IC cards, such as credit cards and the like. This kind of ferroelectric memories have small-sized memory cell arrays and hence particularly short bit lines, resulting in a tendency that their read margins are still smaller.

In general, semiconductor products show variations in chip characteristics, which depend on the positions of chips on a wafer, the positions of wafers in a manufacturing lot, and on manufacturing lots. For this reason, the reduction of read margins results in yield degradation. Moreover, the yield degradation increases the manufacturing cost.

SUMMARY OF THE INVENTION

It is an object of the present invention to ensure that the read operations of semiconductor memories can be performed reliably. Particularly, it is an object of the present invention to improve the data reading margins in the semiconductor memories which include the memory cells each constituted by a variable capacitor and whose storage capacities are small.

According to one of the aspects of the semiconductor memory of the present invention, a plurality of memory cell arrays operate at different timings from each other. Each memory cell array has memory cells each is composed of a variable capacitor and bit lines for inputting data to and outputting data from the memory cells. The bit lines of each memory cell array are connected to the bit lines of each of the other memory cell arrays via the respective connecting wires. Accordingly, the actual capacitances of bit lines of each memory cell array are the capacitances of bit lines of that memory cell array itself plus the capacitances of bit lines of the other memory cell arrays plus the capacitances of the connecting wires. Thus, when data is read from the memory cells by utilizing the capacitive division of the variable capacitors and bit line capacitances, the variations in voltage of the bit lines caused by the capacitive division can be enlarged. As a result, even when semiconductor memories have small-sized memory cell arrays and hence short bit lines therein, the read margins can be prevented from being degraded, and the manufacturing yield of the semiconductor memories can be prevented from being degraded. Additionally, since the variations in voltage of the bit lines are enlarged, the data reading time can be shortened.

According to another aspect of the semiconductor memory of the present invention, the connecting wires are constituted by sub-connecting wires each connected to the memory cell arrays. The sub-connecting wires are interconnected, respectively, via a switching circuit which turns on during a read operation and turns off during a write operation. For this reason, during the write operation, the bit lines are disconnected between the memory cell arrays, so that the bit line capacitances of an operating memory cell array become smaller. Accordingly, the data writing time can be shortened. That is, not only the read cycle but also the write cycle can be shortened.

According to another aspect of the semiconductor memory of the present invention, the connecting wires are formed using the same wiring layer as the bit lines. Since the connecting wires can be formed without increasing the number of wiring layers, the number of photo masks to be used in manufacturing the semiconductor memory is not increased. Moreover, there occurs no degradation of manufacturing yield due to an increase in number of wiring layers. That is, the rise in the manufacturing cost caused by the formation of the connecting wires can be minimized.

According to another aspect of the semiconductor memory of the present invention, the connecting wires are formed in an area adjacent to the memory cell arrays. For this reason, the layout design and layout verification of the connecting wires can be easily performed.

According to another aspect of the semiconductor memory of the present invention, at least a part of the connecting wires are formed using a wiring layer which is different from a wiring layer of the bit lines. For this reason, the flexibility of layout of the connecting wires can be improved, and the layout area of the memory cell arrays and that of the connecting wires can be minimized. For example, forming the connecting wires over the memory cell arrays can reduce the chip size.

According to another aspect of the semiconductor memory of the present invention, each pair of the bit lines is a complementary bit line pair. The lengths of the connecting wires connected to the respective bit lines of each bit line pair are equal to each other. For this reason, the wiring capacitances and wiring resistances of the connecting wires added to the bit lines of each bit line pair can be equalized, and hence the bit lines of each bit line pair can exhibit equal read characteristics and equal write characteristics.

According to another aspect of the semiconductor memory of the present invention, at least two of the connecting wires have a first crossing-over part to exchange wiring paths of the connecting wires. The formation of the crossing-over parts can equalize the parasitic capacitances between each connecting wire and the adjacent connecting wires, independently of the levels of signals transferred through the adjacent connecting wires. As a result, the read and write characteristics of data transferred through the bit lines can be equalized.

According to another aspect of the semiconductor memory of the present invention, a shielding wire to which a predetermined voltage is supplied is formed adjacent to a wiring area where the connecting wires are formed. The shielding wire is connected, for example, to a ground wire or power supply line. For this reason, the connecting wires arranged along the edges of the wiring area can be prevented from being affected by signal lines adjacent to those connecting wires. That is, the connecting wires with an improved noise resistance can be formed.

According to another aspect of the semiconductor memory of the present invention, a data bus line transfers data to the bit lines. A column switch, which is shared by the memory cell arrays, connects the data bus line to a predetermined bit line. Sharing the column switch can reduce the chip size and hence improve the manufacturing yield. As a result, the manufacturing cost can be reduced.

According to another aspect of the semiconductor memory of the present invention, sense amplifiers, which are shared by the memory cell arrays, each amplifies data transferred on the bit lines. Sharing the sense amplifiers can reduce the chip size and hence improve the manufacturing yield. As a result, the manufacturing cost can be reduced.

According to another aspect of the semiconductor memory of the present invention, memory cells are connected to the respective bit lines in accordance with the signal level of the corresponding word line. A word driver supplies a predetermined voltage to the word line. The word driver is arranged between the memory cell arrays, so that the wiring lengths of the connecting wires can be elongated and hence the capacitances of the bit lines can be increased. As a result, the read margin can be further improved.

According to another aspect of the semiconductor memory of the present invention, a plate line is connected to the memory cells. A plate driver supplies a predetermined voltage to the plate line. The plate driver is arranged between the memory cell arrays, so that the wiring lengths of the connecting wires can be elongated and hence the capacitances of the bit lines can be increased. As a result, the read margin can be further improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described below with reference to the drawings.

Figure 1:
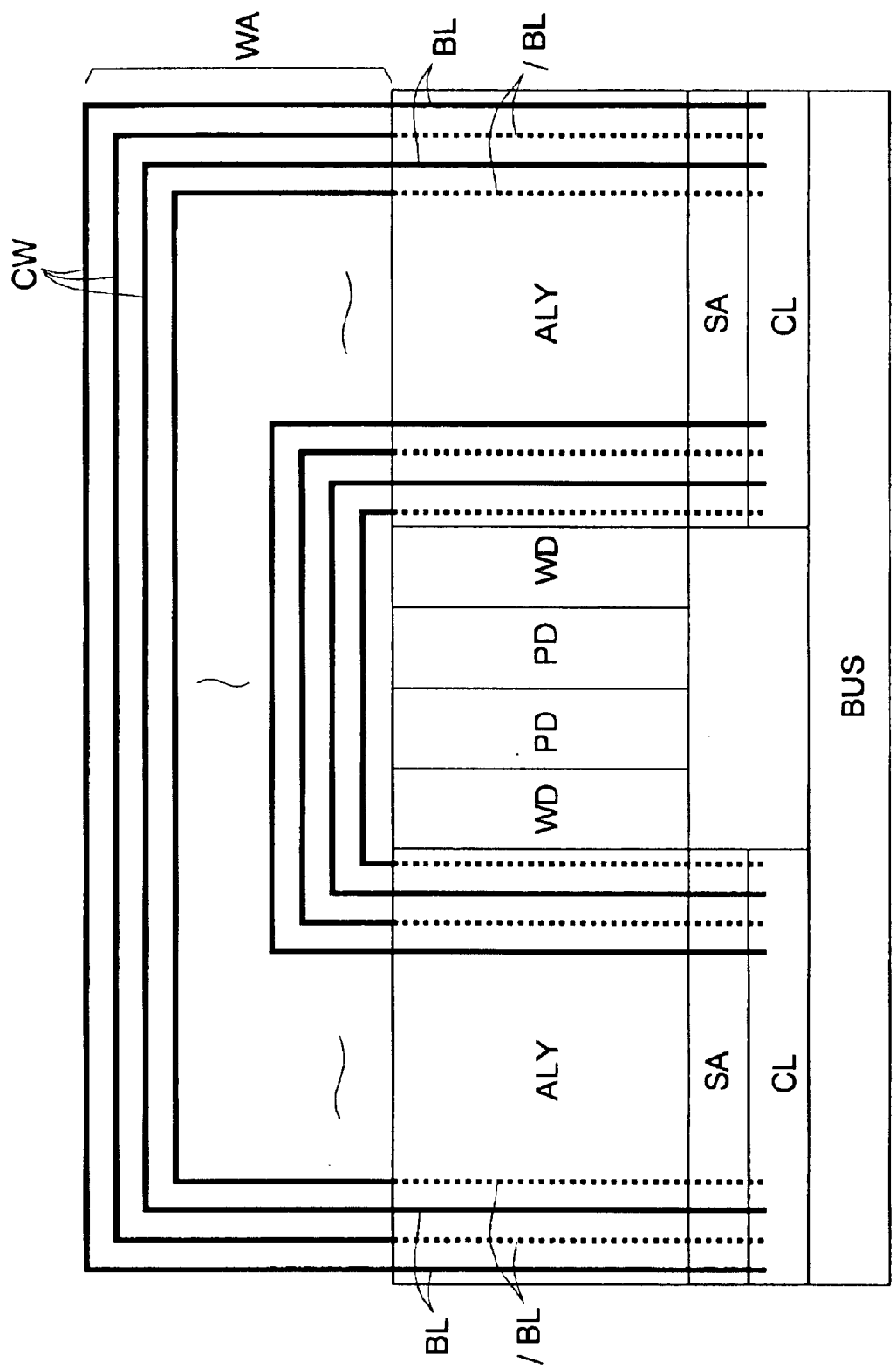
FIG. 1 is a block diagram showing a first embodiment of the present invention.

FIG. 1 shows a first embodiment of semiconductor memory according to the present invention. This semiconductor memory is formed, as a ferroelectric memory, on a silicon substrate using a CMOS process. This ferroelectric memory has a storage capacity of 2 k bits and may be utilized, for example, as an authentication chip mounted on an IC card.

The ferroelectric memory has two memory cell arrays ALY; connecting wires CW that connect the bit lines BL and /BL of one memory cell array ALY to the respective ones of the other memory cell array ALY; word drivers WD associated with the respective memory cell arrays ALY; plate drivers PD also associated with the respective memory cell arrays ALY; sense amplifiers SA also associated with the respective memory cell arrays ALY; column switches CL also associated with the respective memory cell arrays ALY; and a data bus line BUS.

A wiring area WA of the connecting wires CW is formed adjacent to the memory cell arrays ALY. The connecting wires CW are formed using the same second metal wiring layer as the bit lines BL and /BL. This second metal wiring layer is the second one of the metal wiring layers from the semiconductor substrate. Since the connecting wires CW are formed using the same second metal wiring layer as the bit lines BL and /BL, the formation of the connecting wires CW does not increase the number of photo masks to be used in manufacturing the ferroelectric memory.

The connecting wires CW are wired, using only the second metal wiring layer, in the area that is different from the areas where the memory cell arrays ALY are formed. This facilitates the layout design and layout verification of the connecting wires CW.

The sense amplifiers SA and column switches CL are connected to their associated memory cell arrays ALY via the pairs of bit lines BL and /BL.

The two memory cell arrays ALY operate at different timings. That is, the two memory cell arrays ALY do not operate at the same time. While data is being transferred to the bit lines BL (or /BL) of one of the two memory cell arrays ALY, no data is transferred to the bit lines BL (or /BL) of the other.

Figure 2:
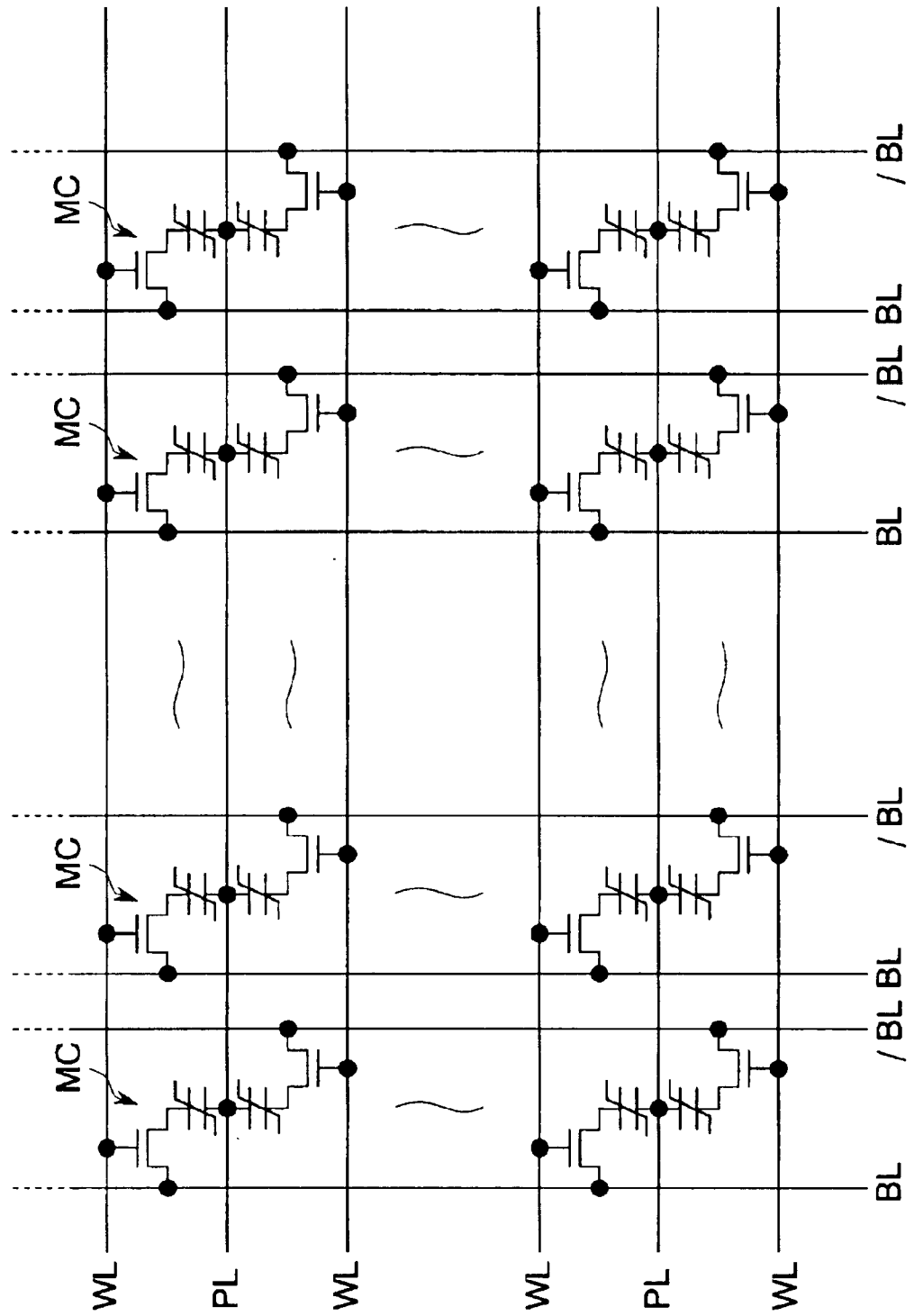
FIG. 2 is a circuit diagram showing the details of the memory cell arrays shown in FIG. 1.

FIG. 2 shows the details of the memory cell arrays ALY shown in FIG. 1.

Each memory cell array ALY has a plurality of ferroelectric memory cells MC which are arranged in a matrix. Each memory cell MC has a ferroelectric capacitor and a transfer transistor which connects one terminal of the ferroelectric capacitor to a bit line BL (or /BL). The gate of the transfer transistor is connected to a word line WL. Each pair of bit lines BL and /BL operates as a complementary bit line pair.

The word lines WL, which are connected to their associated word drivers WD shown in FIG. 1, supply the memory cells MC with a word line voltage generated by the word drivers WD. Plate lines PL, which are connected to their associated plate drivers PD shown in FIG. 1, supply the memory cells MC with a plate line voltage generated by the plate drivers PD.

In a read operation, the bit lines are precharged to the ground voltage, and thereafter, while a word line WL being kept at a high level, a pulse signal of high level is supplied to the plate line PL. Then, data is transferred to one bit line of each complementary pair of bit lines BL and /BL, so that the voltage of that bit line varies. The other bit line, which has been precharged to the ground voltage, acts as a reference bit line. The associated sense amplifier SA shown in FIG. 1 amplifiers the voltage difference between that bit line and the reference bit line, whereby the data stored in each memory cell MC can be read out.

In this embodiment, the bit lines BL and /BL of one memory cell array ALY are connected to the respective ones of the other memory cell array ALY via the connecting wires CW. For this reason, the capacitances of the bit line BL or /BL of each memory cell array ALY are equal to the capacitances inherent in the bit line BL or /BL of the two memory cell arrays ALY plus the capacitances inherent in the connecting wires CW. Thus, the capacitances of the bit line BL (or /BL) relative to the capacitances of the ferroelectric capacitors are larger than that in the conventional art. As a result, in the read operation, the signal amounts of data read from the memory cells MC to the bit line BL (or /BL) (the voltage differences between the bit lines BL and /BL of the respective bit line pairs) are larger. That is, the read margin can be improved. In addition, since the voltage differences between the bit lines BL and /BL of the respective bit line pairs are larger, the associated sense amplifier SA can amplify the voltage differences therebetween to predetermined values in a shorter time. As a result, the read operation time can be shortened.

In the present embodiment described above, since the bit lines BL and /BL of one of the two memory cell arrays ALY are connected to the respective ones of the other via the connecting wires CW, the variations in voltage of the bit lines BL (or /BL) during the read operation can be enlarged. As a result, the read margin can be improved, and the manufacturing yield of the ferroelectric memories can be improved. Additionally, since the variations in voltage of the bit lines BL and /BL are enlarged, the data reading time can be shortened. The present embodiment is effective especially in a case where the memory cell arrays ALY are small in size and where the bit lines BL and /BL in the memory cell arrays ALY are short in length.

As previously described, the connecting wires CW are formed using the same second metal wiring layer as the bit lines BL and /BL. This can prevent the formation of the connecting wires CW from increasing the number of wiring layers. That is, the rise of the manufacturing cost caused by the formation of the connecting wires CW can be minimized.

Since the connecting wires CW are formed in an area adjacent to the memory cell arrays ALY, the layout design and layout verification of the connecting wires CW can be readily performed. For example, the present invention is effective in a case of adding the connecting wires CW to an already-developed ferroelectric memory so as to improve the read margin. The present invention is also effective in a case of adding connecting wires CW in accordance with the storage capacity of a ferroelectric memory core implemented in a system LSI.

The word drivers WD and plate drivers PD are arranged between the two memory cell arrays ALY. This arrangement can provide elongated wire lengths of the connecting wires CW and hence provide increased capacitances of the bit lines BL and /BL. As a result, the read margin can be further improved.

Figure 3:
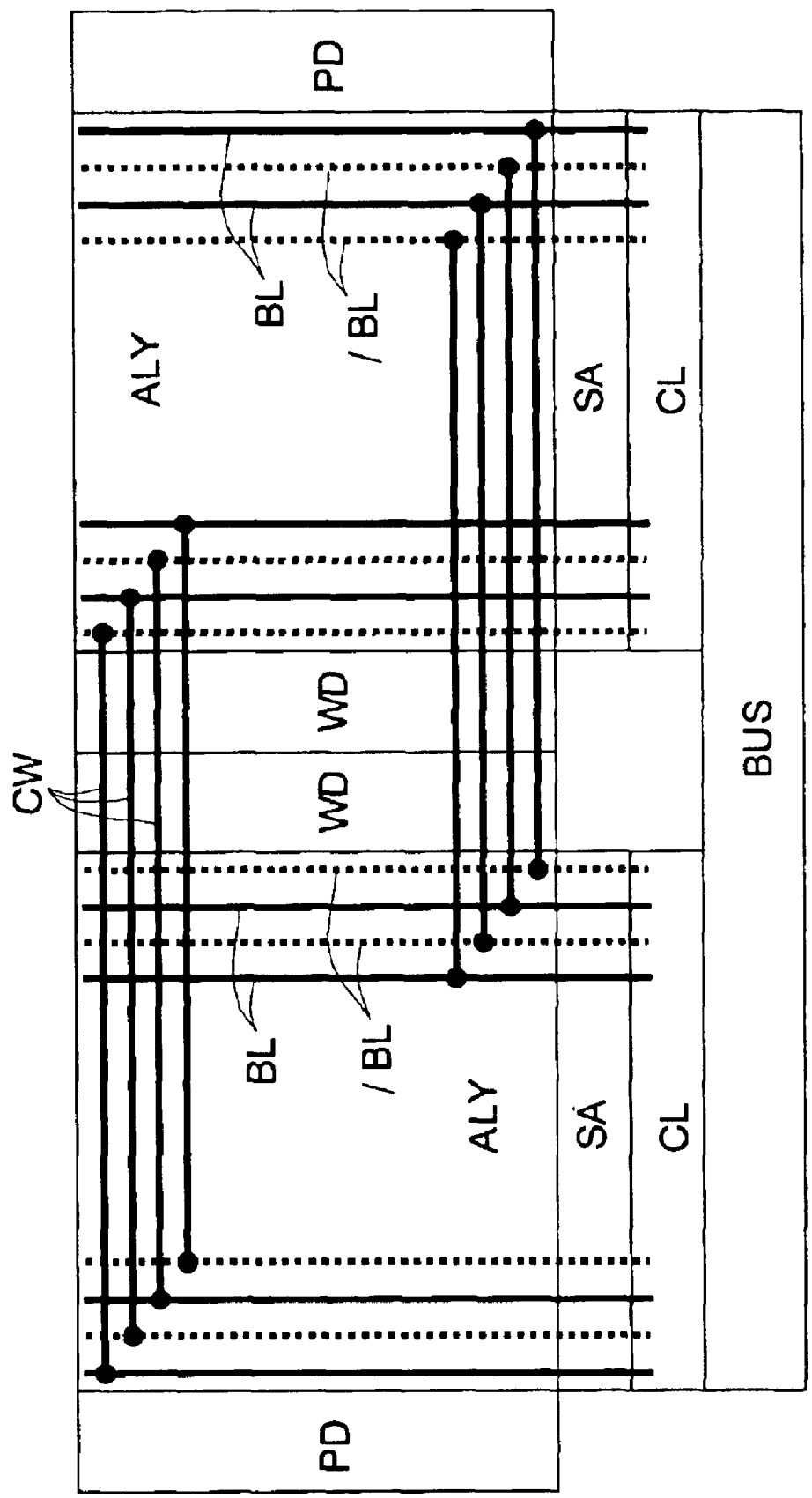
FIG. 3 is a block diagram showing a second embodiment of the present invention.

FIG. 3 shows a second embodiment of semiconductor memory according to the present invention. In the second embodiment, elements corresponding to the same elements in the first embodiment are identified by the same reference designations and their detailed descriptions are omitted.

In the second embodiment, a word driver WD and a plate driver PD are formed on the respective sides of each memory cell array ALY. Connecting wires CW are wired over the memory cell arrays ALY along the lateral direction of FIG. 3. Bit lines BL and /BL are formed using the second metal wiring layer, while the connecting wires CW are formed using the third metal wiring layer overlying the second metal wiring layer. In other words, since the connecting wires CW are formed using a wiring layer different from the wiring layer of the bit lines BL and /BL, the connecting wires CW can be formed over the memory cell arrays ALY. Since the wiring area of the connecting wires CW need not be formed beside the memory cell arrays ALY, the chip size of the ferroelectric memory is smaller than that of the first embodiment.

The connecting wires CW connects the bit lines BL and /BL of one memory cell array ALY to the respective bit lines BL and /BL of the other, which are arranged at the corresponding same positions. For this reason, the wiring lengths of the connecting wires CW are all the same. The lengths of the bit lines BL and /BL in each memory cell array ALY are all the same. Thus, the capacitances added to the bit lines BL and /BL in each memory cell array ALY are all the same. That is, all of the bit lines BL and /BL exhibit the same read and write characteristics.

The present embodiment can provide similar effects to the foregoing first embodiment. Additionally, according to the present embodiment, the connecting wires CW are formed using the third metal wiring layer which is different from the wiring layer of the bit lines BL and /BL. Thus, the connecting wires CW can be formed over the memory cell arrays ALY, so that the chip size can be reduced.

Since all the wiring lengths of the connecting wires CW are the same, the capacitances added to the bit lines BL and /BL in each memory cell array ALY can be equal. As a result, all of the bit lines BL and /BL can exhibit equal read characteristics and equal write characteristics.

Figure 4:
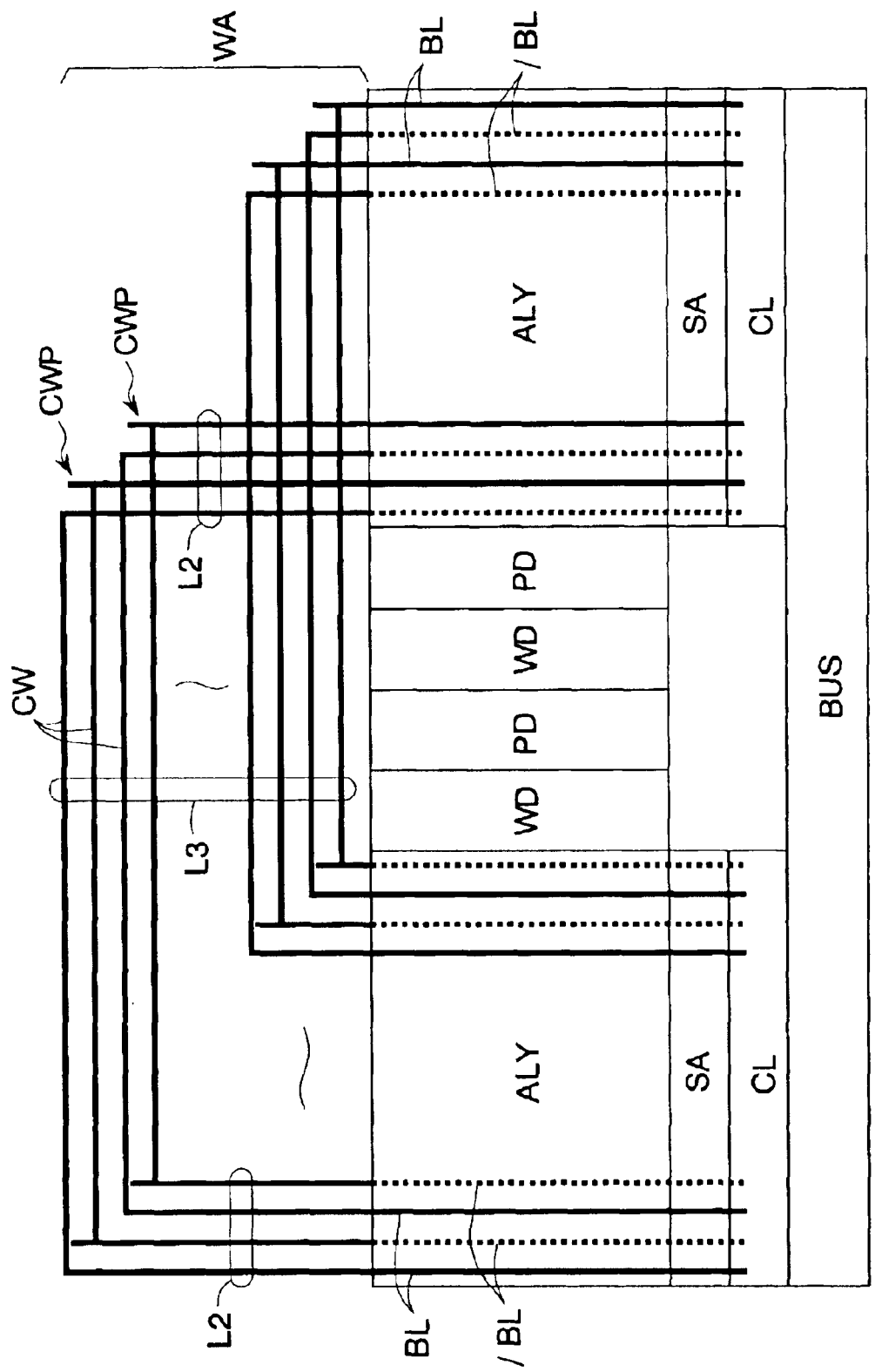
FIG. 4 is a block diagram showing a third embodiment of the present invention.

FIG. 4 shows a third embodiment of semiconductor memory according to the present invention. In this third embodiment, elements corresponding to the same elements in the first embodiment are identified by the same reference designations and their detailed descriptions are omitted.

In the present embodiment, connecting wires CW are formed partially using the same second metal wiring layer L2 as bit lines BL and /BL and partially using the third metal wiring layer L3 overlying the second metal wiring layer L2. The wiring area WA of the connecting wires CW is formed adjacent to the memory cell arrays ALY. There are formed projection wires CWP which project in the extending direction of the bit lines BL and /BL at the corners of a part of the connecting wires CW. This formation of the projection wires CWP provides an equal wire length and an equal wire capacitance of the connecting wires CW for each pair of bit lines BL and /BL. The structures in the present embodiment other than the structure of the connecting wires CW are the same as in the first embodiment.

Figure 5:
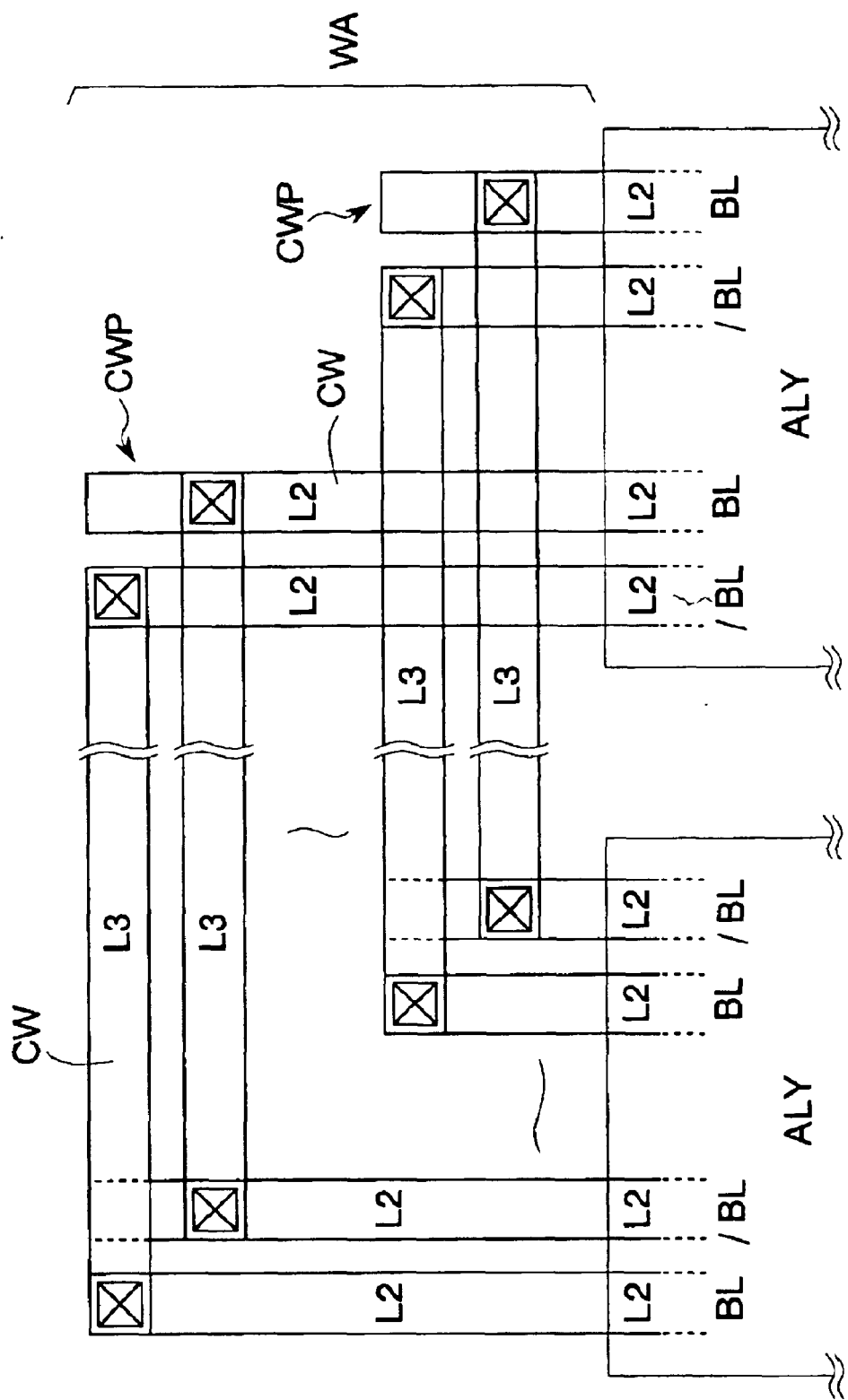
FIG. 5 is a layout diagram showing the details of the essential portions of the connecting wires of FIG. 4.

FIG. 5 shows the details of the essential portions of the connecting wires CW of FIG. 4.

The portions of the connecting wires CW directly connected to the bit lines BL and /BL (extend in the vertical direction of FIG. 5) are formed using the same second metal wiring layer L2 as the bit lines BL and /BL. The wire lengths of the connecting wires CW of the second metal wiring layer L2 are the same for each pair of bit lines BL and /BL. The connecting wires CW of the second metal wiring layer L2 associated with the memory cell arrays ALY are interconnected via the third metal wiring layer L3. The second and third metal wiring layers L2 and L3 are connected to each other through contact holes.

The present embodiment can provide similar effects to the foregoing first and second embodiments. In addition, the present embodiment can provide an improved flexibility of the layout of the connecting wires CW. As a result, even in a case where the wiring lengths of the connecting wires CW are established to be the same for each pair of bit lines BL and /BL, the layout dimensions of the wiring area WA of the connecting wires CW can be minimized.

Figure 6:
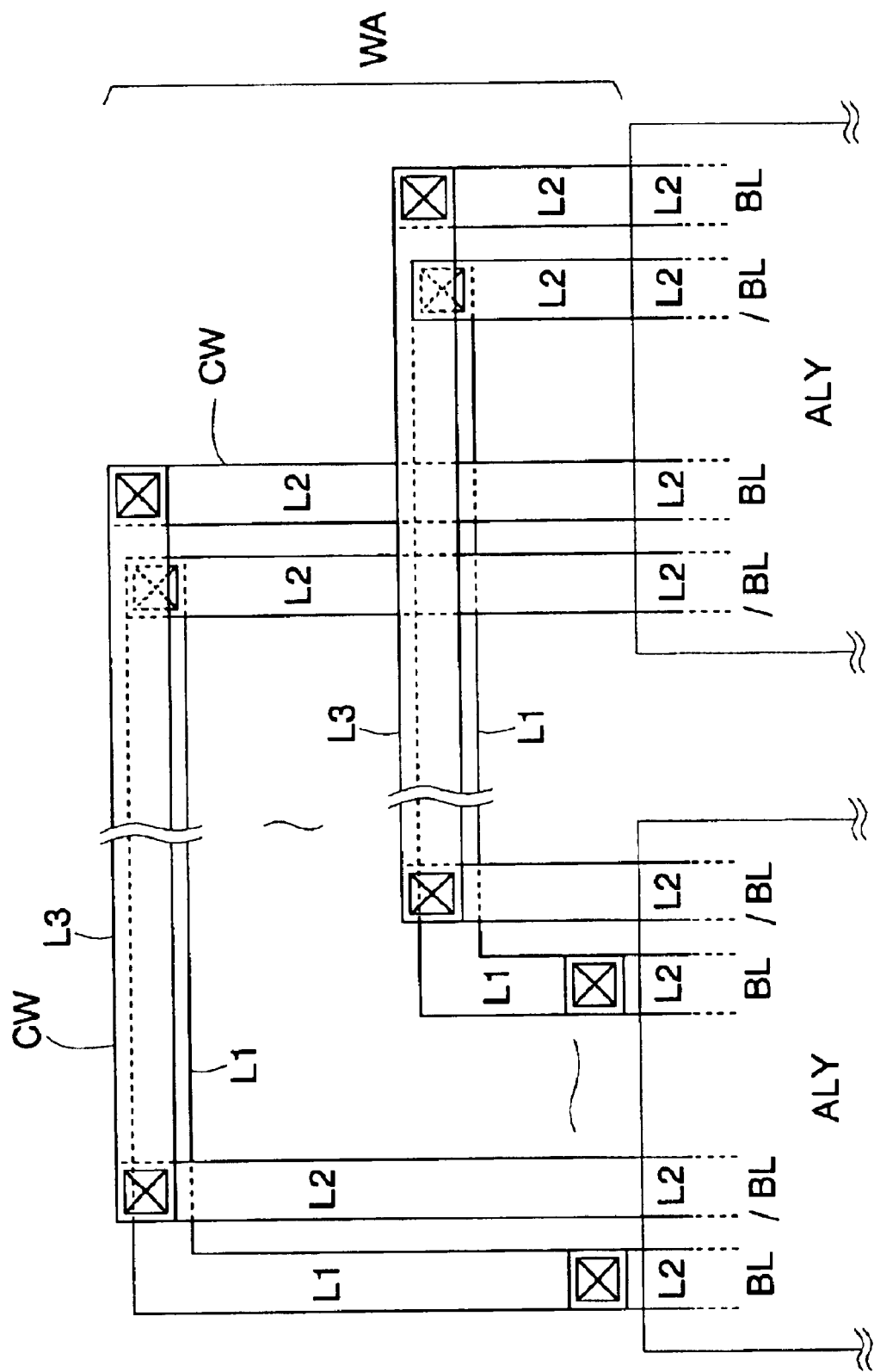
FIG. 6 is a layout diagram showing the essential portions of the fourth embodiment of the present invention.

FIG. 6 shows the details of the essential portions of a fourth embodiment of semiconductor memory according to the present invention. In this fourth embodiment, elements corresponding to the same elements in the first and third embodiments are identified by the same reference designations and their detailed descriptions are omitted.

In the present embodiment, connecting wires CW are formed using the first, second, and third metal wiring layers L1, L2, and L3. For this reason, the wiring lengths of the connecting wires CW for each pair of bit lines BL and /BL can be the same without forming the projection wires CWP of the third embodiment. The other structures in the present embodiment are the same as in the third embodiment (FIG. 4).

The present embodiment can provide similar effects to the foregoing first and third embodiments.

Figure 7:
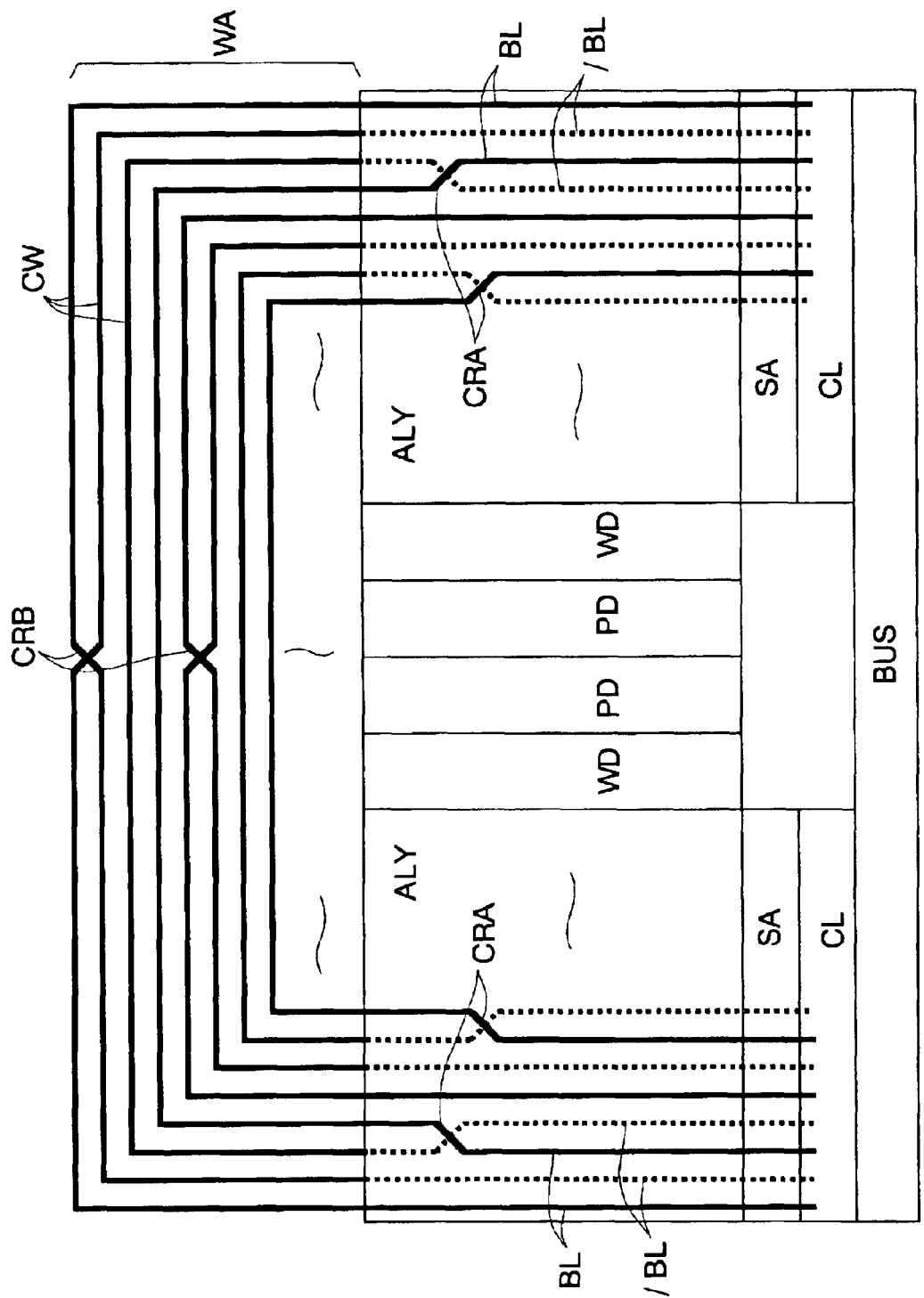
FIG. 7 is a block diagram showing a fifth embodiment of the present invention.

FIG. 7 shows a fifth embodiment of semiconductor memory according to the present invention. In the fifth embodiment, elements corresponding to the same elements in the first embodiment are identified by the same reference designations and their detailed descriptions are omitted.

In the present embodiment, there are formed crossing-over parts CRA (first crossing-over parts) where the bit lines BL and /BL of bit line pairs cross over each other over the memory cell array ALY. These crossing-over parts CRA are formed at every second pair of bit lines BL and /BL. There are also formed crossing-over parts CRB (second crossing-over parts) where the two connecting wires CW associated with a respective one of the other pairs of bit lines BL and /BL cross over each other over the wiring area WA. These crossing-over parts CRB are formed in association with the bit line pairs having no crossing-over parts CRA. That is, each pair of bit lines BL and /BL has a bit-line-twisted structure. The other structures in the present embodiment are the same as that in the first embodiment.

Figure 8:
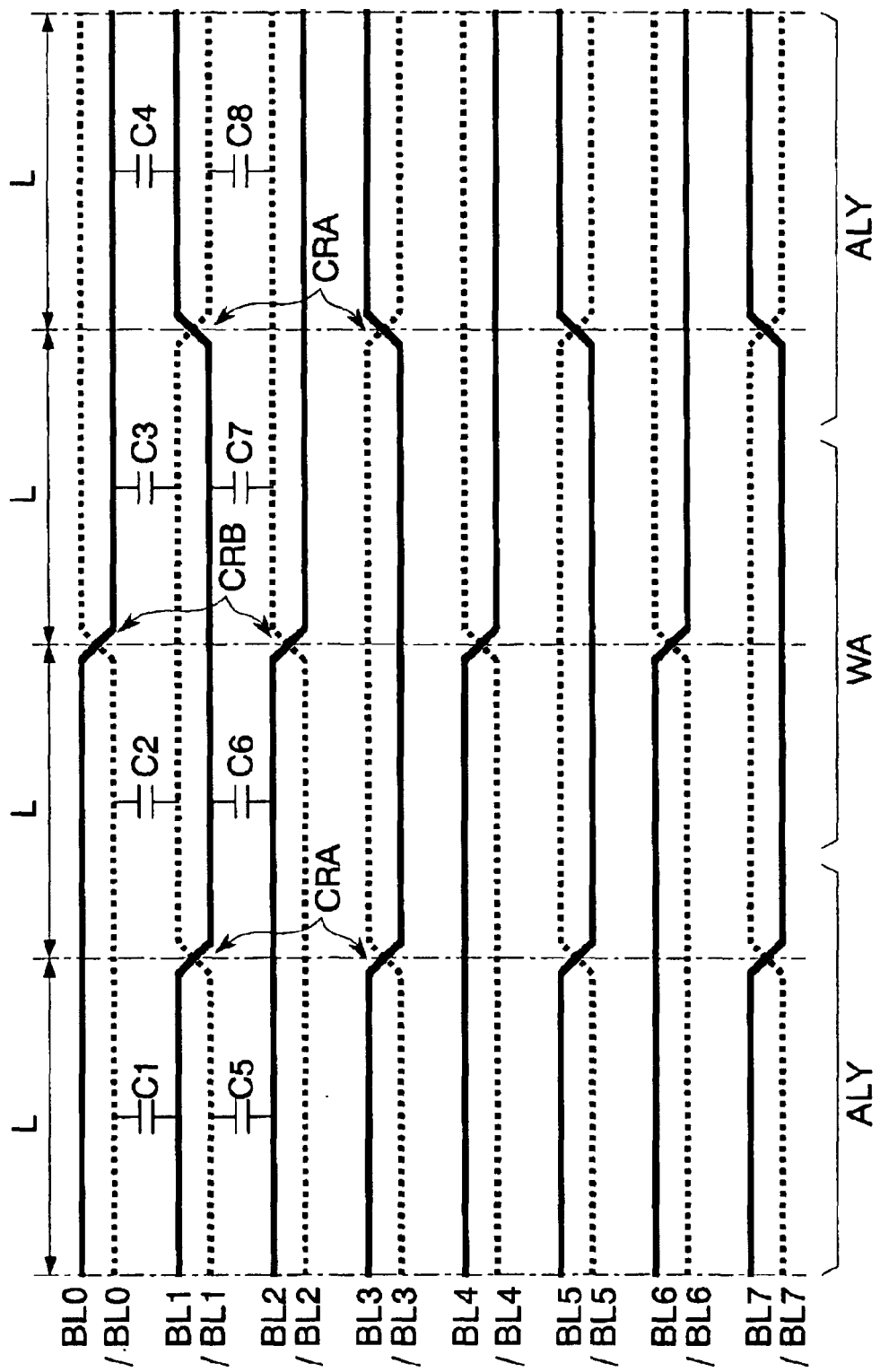
FIG. 8 is an explanatory diagram showing the details of the crossing-over parts of FIG. 7.

FIG. 8 is an explanatory diagram showing the details of the crossing-over parts CRA and CRB formed in their associated bit line pairs and connecting wire pairs, respectively. To facilitate understanding, the connecting wires CW in the wiring area WA are shown as bit lines BL (by solid lines) and /BL (by dotted lines).

Each of the bit lines BL and /BL including those in the wiring area WA is divided into quarters by a length L. The crossing-over parts CRA are formed in every second bit line pair in the memory cell arrays ALY with their respective positions being away by the length L from the respective ends of that bit line pair. The crossing-over part CRB is formed, in the wiring area WA, at the center of each of the bit line pairs having no crossing-over parts CRA. That is, the pairs of bit lines BL and /BL each having two crossing-over parts CRA are interleaved with the pairs of bit lines BL and /BL each having one crossing-over part CRB.

In the present embodiment, for example, the lengths by which a bit line BL1 is adjacent to bit lines BL0, /BL0, BL2 and /BL2 are all L. Similarly, the lengths by which a bit line /BL1 is adjacent to the bit lines BL0, /BL0, BL2 and /BL2 are all L. For this reason, with respect to the pair of the bit lines BL1 and /BL1, the parasitic capacitance occurring between the bit line BL1 and the adjacent bit lines BL0, /BL0, BL2 and /BL2 is equal to the parasitic capacitance occurring between the bit line /BL1 and the adjacent bit lines BL0, /BL0, BL2 and /BL2 (i.e., C1+C6+C7+C4=C5+C2+C3+C8).

Thus, the capacitances of the bit lines BL1 and /BL1 are always equal to each other independently of the levels of signals transferred through the adjacent bit lines BL0, /BL0, BL2 and /BL2. With respect to the other pairs of bit lines BL and /BL, the capacitances occurring between those bit lines and the adjacent bit lines BL and /BL are also equal. As a result, the reading and writing characteristics of the data transferred through the bit lines BL and /BL are equal.

The present embodiment can provide similar effects to the foregoing first embodiment. Additionally, in the present invention, there are formed the crossing-over parts CRA or the crossing-over part CRB in each pair of bit lines BL and /BL. For this reason, even in a case where the pairs of bit lines BL and /BL of one memory cell array ALY are connected to the respective pairs of bit lines BL and /BL of the other memory cell array ALY via the connecting wires CW, the reading and writing characteristics of the data transferred through the bit lines BL and /BL can be equal.

Figure 9:
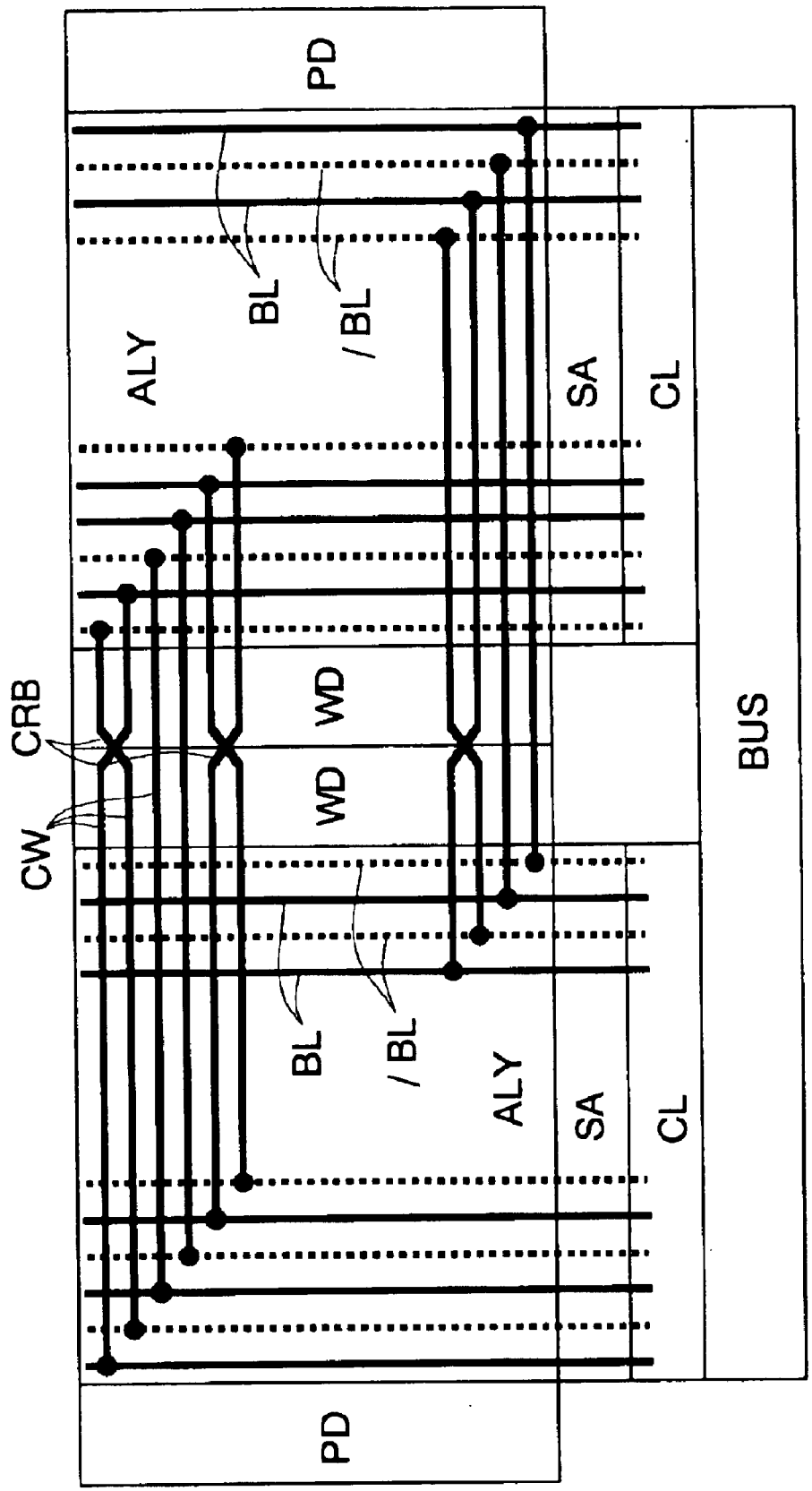
FIG. 9 is a block diagram showing a sixth embodiment of the present invention.

FIG. 9 shows a sixth embodiment of semiconductor memory according to the present invention. In this sixth embodiment, elements corresponding to the same elements in the first, second and fifth embodiments are identified by the same reference designations and their detailed descriptions are omitted.

According to the present embodiment, crossing-over parts CRB are formed in connecting wires CW of the second embodiment (FIG. 3). The other structures in the present embodiment are the same as in the second embodiment. More particularly, there is formed the crossing-over part CRB in the connecting wires CW associated with every second pair of bit lines BL and /BL. Although not shown in the figure, crossing-over parts CRA (as of FIG. 7) are formed in the other every second pair of bit lines BL and /BL in the memory cell arrays ALY.

The present embodiment can provide similar effects to the foregoing first, second and fifth embodiments.

Figure 10:
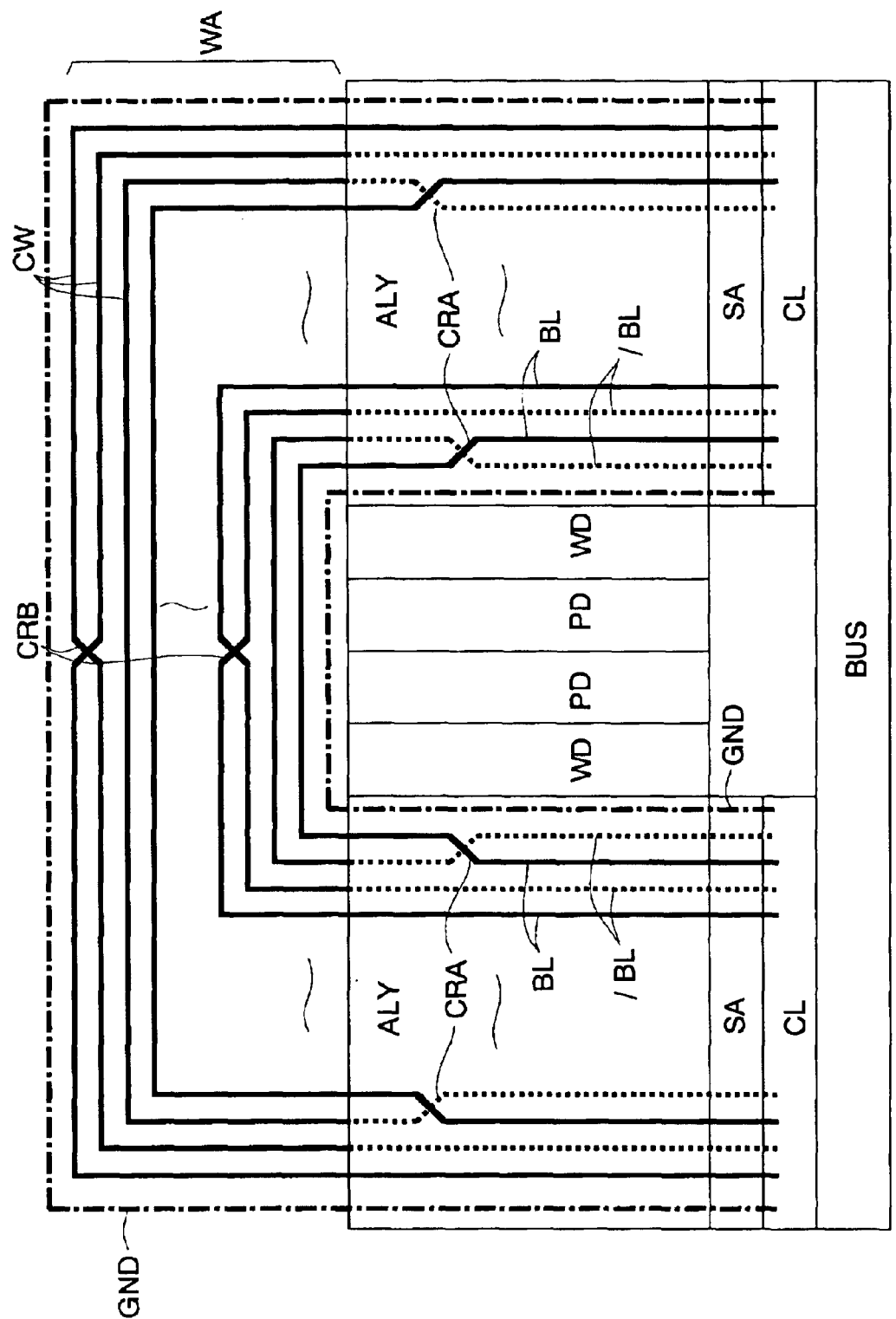
FIG. 10 is a block diagram showing a seventh embodiment of the present invention.

FIG. 10 shows a seventh embodiment of semiconductor memory according to the present invention. In this seventh embodiment, elements corresponding to the same elements in the first and fifth embodiments are identified by the same reference designations and their detailed descriptions are omitted.

According to the present embodiment, a shielding wire (shown by alternate long and short dash lines) is formed around the outside of a wiring area WA, along the edges of memory cell arrays ALY and along connecting wires CW and bit lines BL and /BL as of the fifth embodiment (FIG. 7). This shielding wire is connected to a ground wire GND. The other structures in the present embodiment are the same as in the fifth embodiment.

The present embodiment can provide similar effects to the foregoing first and fifth embodiments. Additionally, in the present embodiment, since the shielding wire connected to the ground wire GND is formed around the outside of the wiring area WA, it can prevent the connecting wires CW arranged along the edges of the wiring area WA from being affected by signal lines adjacent to those connecting wires CW. That is, the connecting wires CW exhibit an improved noise resistance.

Figure 11:
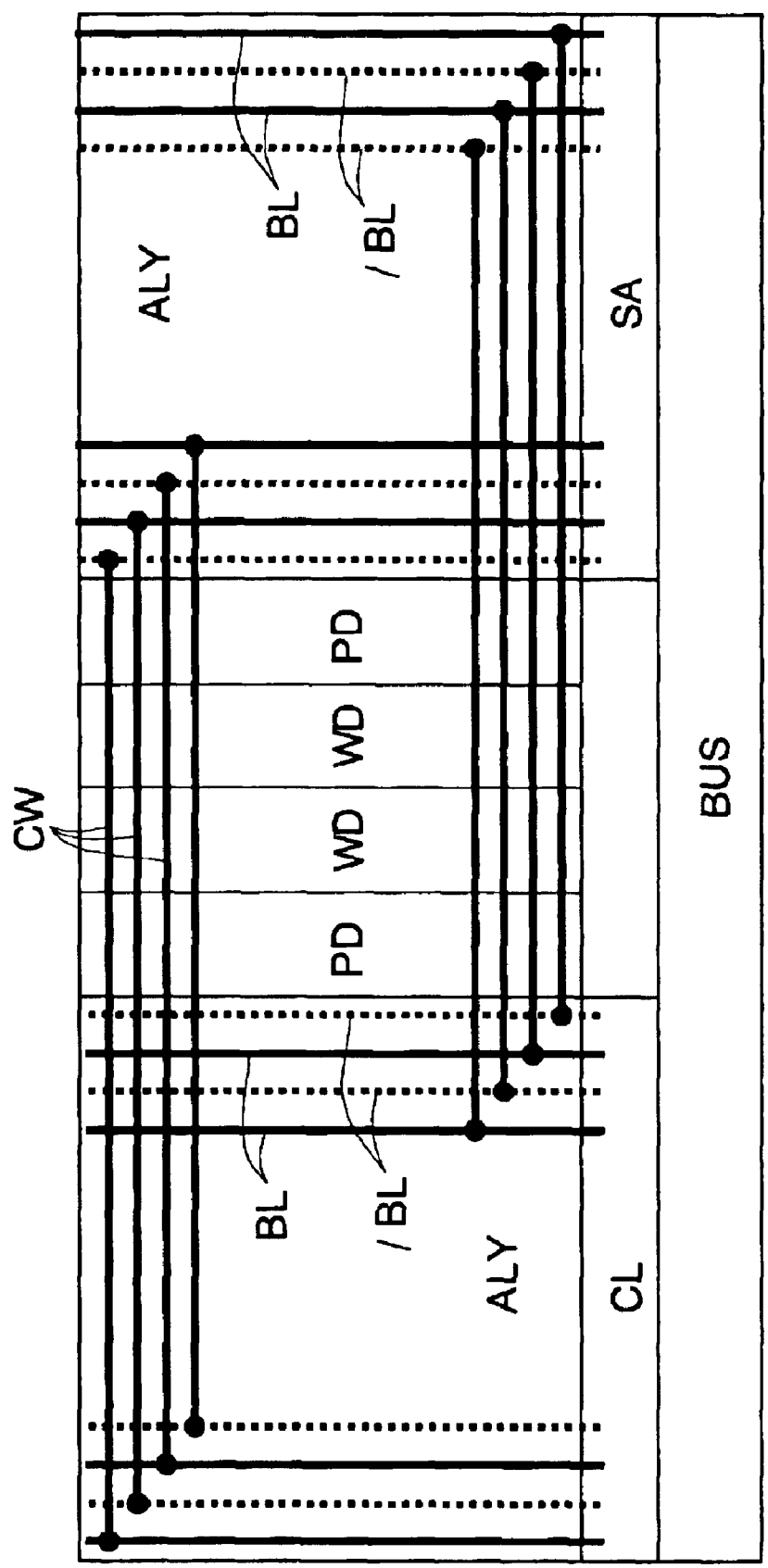
FIG. 11 is a block diagram showing an eighth embodiment of the present invention.

FIG. 11 shows an eighth embodiment of semiconductor memory according to the present invention. In this eighth embodiment, elements corresponding to the same elements in the first and second embodiments are identified by the same reference designations and their detailed descriptions are omitted.

According to the present embodiment, a sense amplifier SA and a column switch CL are shared by two memory cell arrays ALY. That is, the sense amplifier SA is connected to the bit lines BL and /BL of the memory cell array ALY on the right side of the figure, while the column switch CL is connected to the bit lines BL and /BL of the memory cell array ALY on the left side of the figure.

The sense amplifier SA is connected to the bit lines BL and /BL of the memory cell array ALY on the left side via connecting wires CW, while the column switch CL is connected to the bit lines BL and /BL of the memory cell array ALY on the right side via the connecting wires CW. In other words, since the bit lines BL and /BL of the two memory cell arrays ALY are interconnected via the connecting wires CW, the sense amplifier SA and column switch CL can be readily shared by the two memory cell arrays ALY. A data bus line BUS is connected to the bit lines BL and /BL via the column switch CL. The other structures in the present embodiment are the same as in the second embodiment.

The present embodiment can provide similar effects to the foregoing first and second embodiments. Additionally, in the present embodiment, since the sense amplifier SA and column switch CL are shared by the two memory cell arrays ALY, the chip size of the ferroelectric memory can be reduced and the manufacturing yield can be improved. As a result, the manufacturing cost can be reduced.

Figure 12:
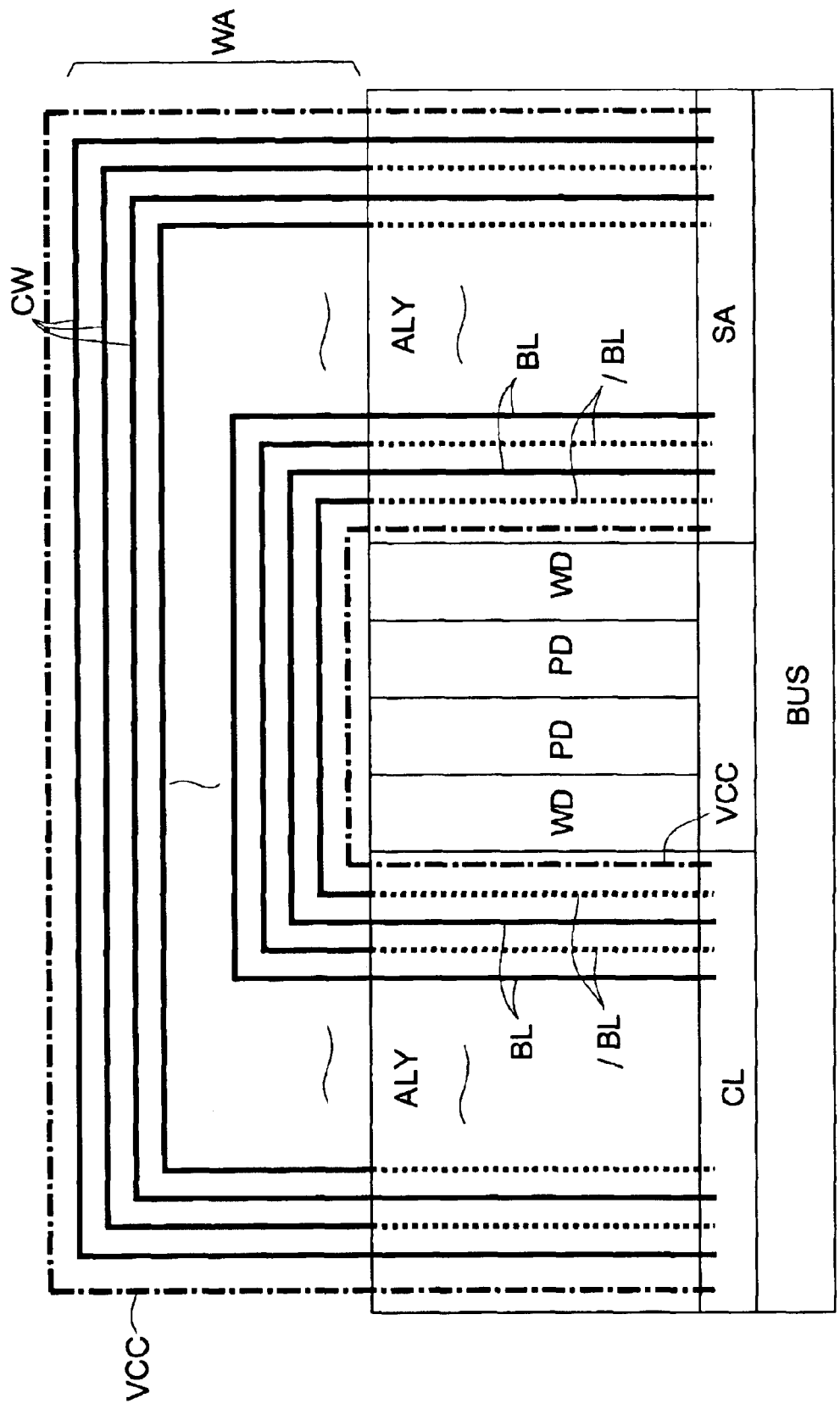
FIG. 12 is a block diagram showing a ninth embodiment of the present invention.

FIG. 12 shows a ninth embodiment of semiconductor memory according to the present invention. In this ninth embodiment, elements corresponding to the same elements in the first embodiment are identified by the same reference designations and their detailed descriptions are omitted.

According to the present embodiment, a shielding wire (shown by alternate long and short dash lines) is formed around the outside of a wiring area WA, along the edges of memory cell arrays ALY and along connecting wires CW and bit lines BL and /BL as of the first embodiment (FIG. 1). This shielding wire is connected to a power supply line VCC. Additionally, a sense amplifier SA and a column switch CL are shared by the two memory cell arrays ALY as in the eighth embodiment (FIG. 11). That is, the sense amplifier SA is connected to the bit lines BL and /BL of the memory cell array ALY on the right side of the figure, while the column switch CL is connected to the bit lines BL and /BL of the memory cell array ALY on the left side of the figure. The other structures in the present embodiment are the same as in the first embodiment.

The present embodiment can provide similar effects to the foregoing first, seventh and eighth embodiments.

Figure 13:
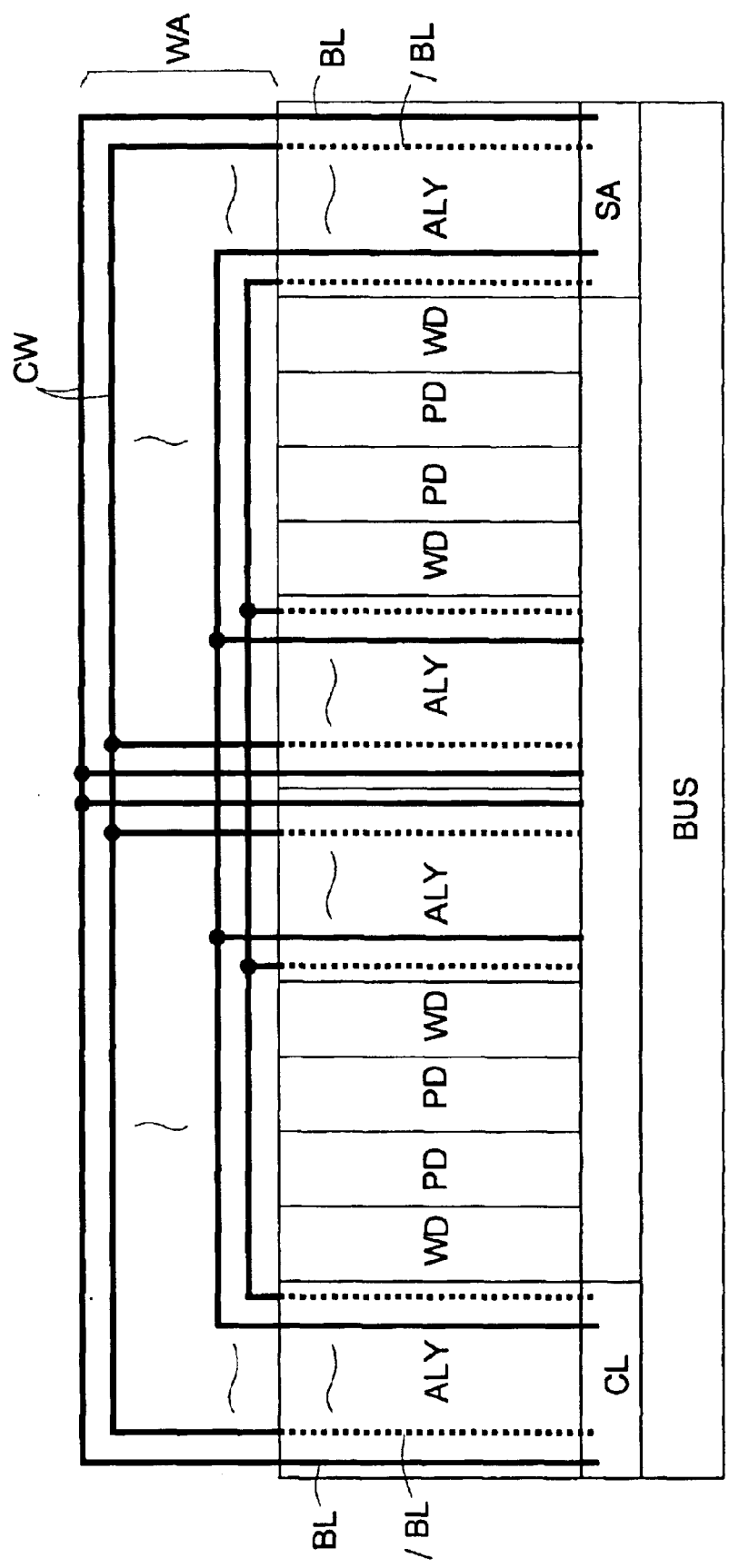
FIG. 13 is a block diagram showing a tenth embodiment of the present invention.

FIG. 13 shows a tenth embodiment of semiconductor memory according to the present invention. In this tenth embodiment, elements corresponding to the same elements in the first embodiment are identified by the same reference designations and their detailed descriptions are omitted.

According to the present embodiment, a ferroelectric memory has four memory cell arrays ALY. The bit lines BL and /BL of each memory cell array ALY are connected to the respective bit lines BL and /BL of each of the other memory cell arrays ALY via connecting wires CW. The connecting wires CW are formed in a wiring area WA adjacent to the memory cell arrays ALY. A sense amplifier SA and a column switch CL are shared by the four memory cell arrays ALY as in the eighth embodiment (FIG. 11). That is, the sense amplifier SA is connected to the bit lines BL and /BL of the memory cell array ALY on the right side of the figure, while the column switch CL is connected to the bit lines BL and /BL of the memory cell array ALY on the left side of the figure. The other structures in the present embodiment are the same as in the first embodiment.

The present embodiment can provide similar effects to the foregoing first and eighth embodiments.

Figure 14:
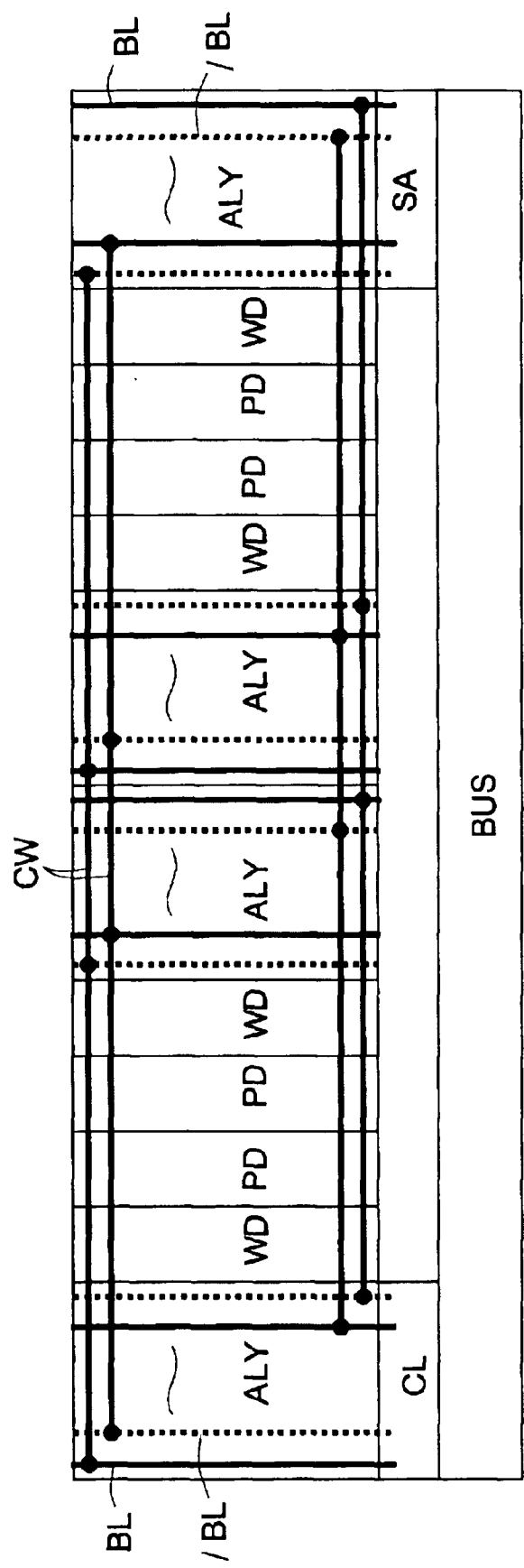
FIG. 14 is a block diagram showing an eleventh embodiment of the present invention.

FIG. 14 shows an eleventh embodiment of semiconductor memory according to the present invention. In this eleventh embodiment, elements corresponding to the same elements in the first and second embodiments are identified by the same reference designations and their detailed descriptions are omitted.

According to the present embodiment, a ferroelectric memory has four memory cell arrays ALY. The bit lines BL and /BL of each memory cell array ALY are connected to the respective bit lines BL and /BL of each of the other memory cell arrays ALY via connecting wires CW formed over the memory cell arrays ALY. A sense amplifier SA and a column switch CL are shared by the four memory cell arrays ALY as in the eighth embodiment (FIG. 11). That is, the sense amplifier SA is connected to the bit lines BL and /BL of the memory cell array ALY on the right side of the figure, while the column switch CL is connected to the bit lines BL and /BL of the memory cell array ALY on the left side of the figure. The other structures in the present embodiment are the same as in the first and second embodiments.

The present embodiment can provide similar effects to the foregoing first, second and eighth embodiments.

Figure 15:
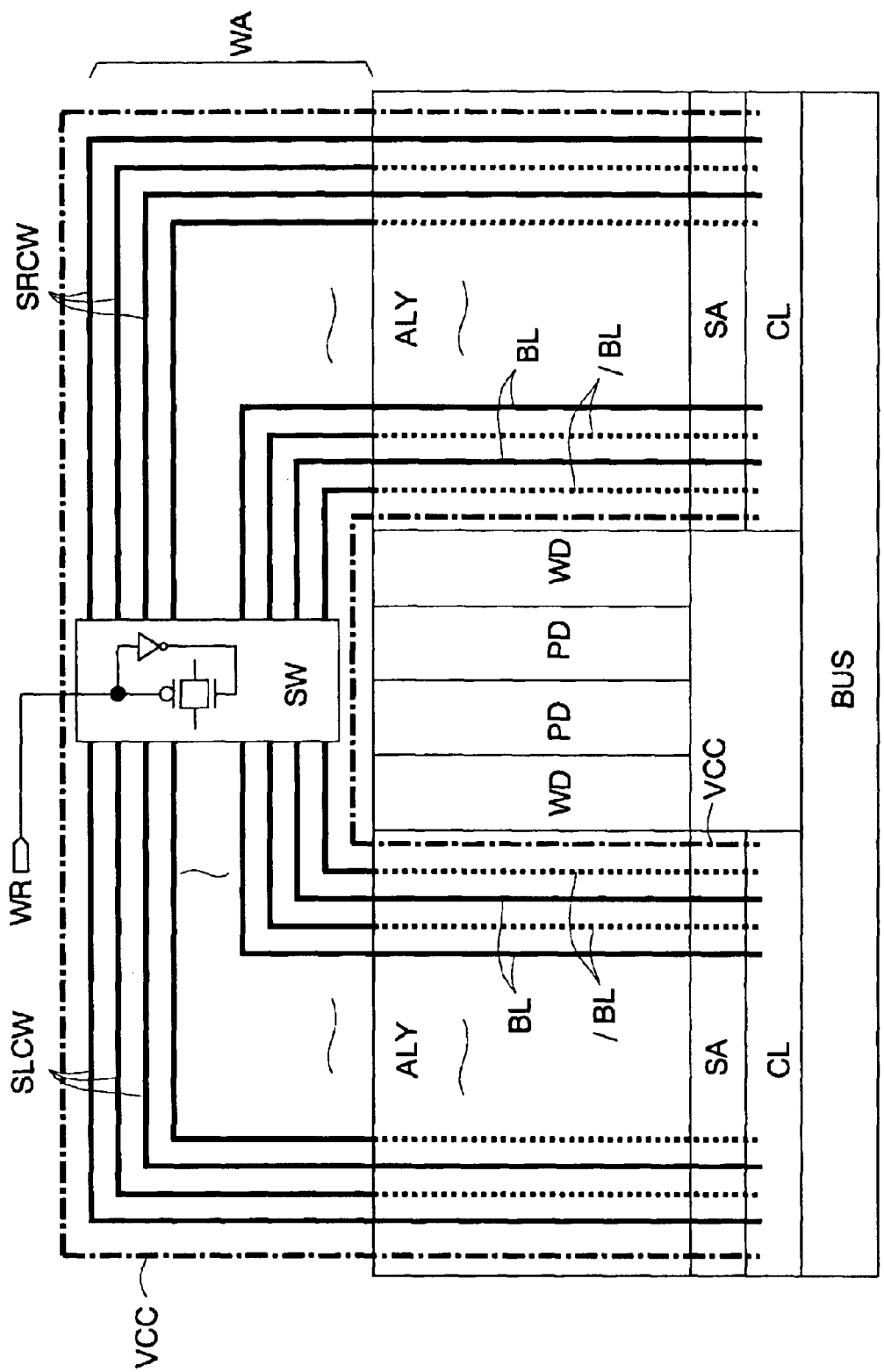
FIG. 15 is a block diagram showing a twelfth embodiment of the present invention.

FIG. 15 shows a twelfth embodiment of semiconductor memory according to the present invention. In this twelfth embodiment, elements corresponding to the same elements in the first and ninth embodiments are identified by the same reference designations and their detailed descriptions are omitted.

According to the present embodiment, the same shielding wire as in the ninth embodiment (FIG. 12) is added to the first embodiment (FIG. 1). Additionally, there are formed, in a wiring area WA, sub-connecting wires SLCW connected to the bit lines BL and /BL of a memory cell array ALY on the left side of the figure, and sub-connecting wires SRCW connected to the bit lines BL and /BL of a memory cell array ALY on the right side of the figure. These sub-connecting wires SLCW and SRCW are interconnected via a switch circuit SW. The other structures in the present embodiment are the same as in the first embodiment.

The switch circuit SW has a plurality of CMOS transmission gates for interconnecting the respective sub-connecting wires SLCW and SRCW. The CMOS transmission gates are turned off when receiving a write signal WR which exhibits a high level during a write operation. That is, the bit lines of the two memory cell arrays ALY are disconnected during the write operation, and are interconnected other than during the write operation (i.e., during the read operation). The capacitances of the bit lines BL and /BL during the write operation are smaller than those during the read operation. Thus, the write operation time is shortened.

The present embodiment can provide similar effects to the foregoing first and seventh embodiments. In addition, not only the read cycle but also the write cycle can be shortened.

Figure 16:
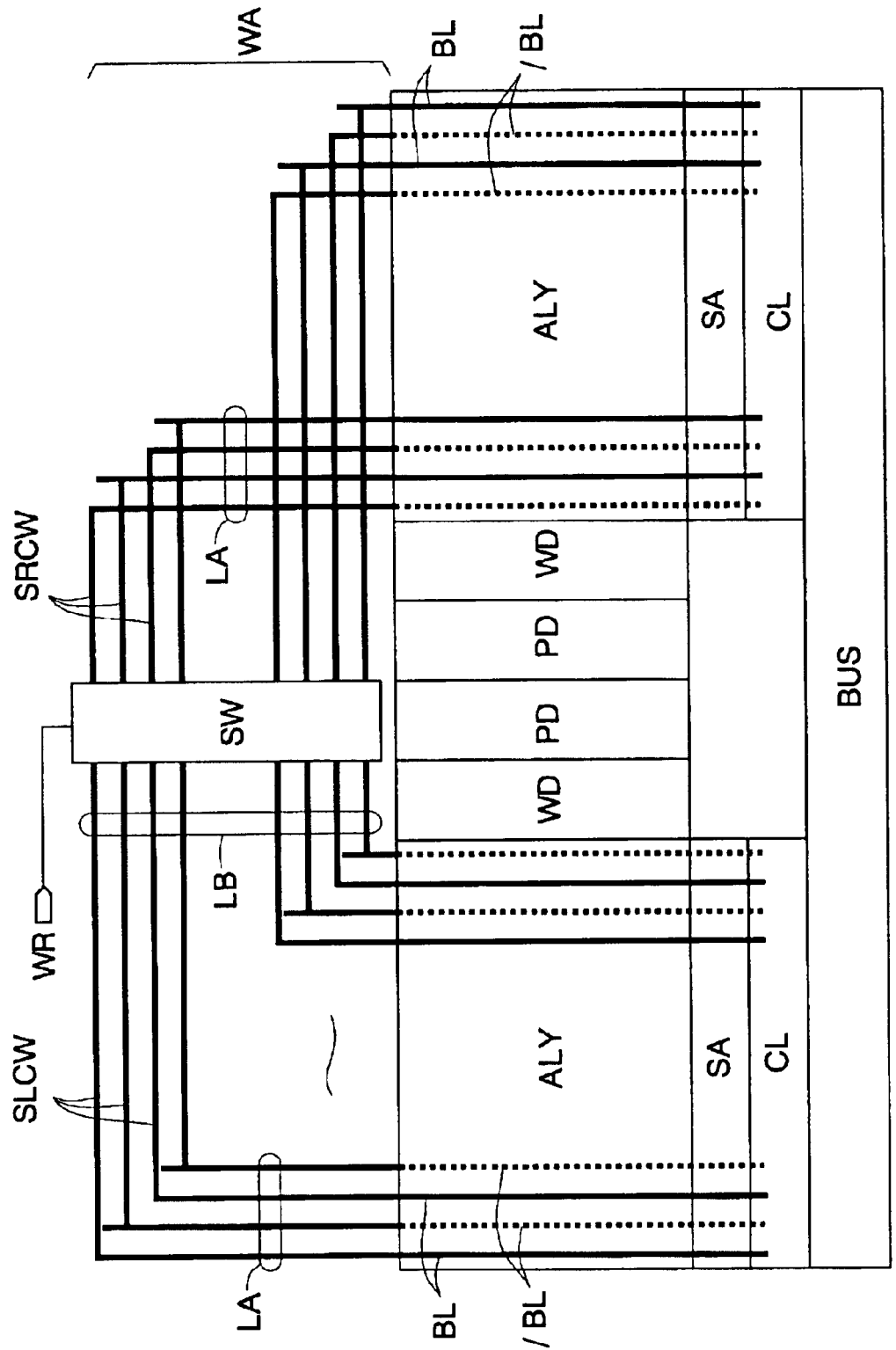
FIG. 16 is a block diagram showing a thirteenth embodiment of the present invention.

FIG. 16 shows a thirteenth embodiment of semiconductor memory according to the present invention. In this thirteenth embodiment, elements corresponding to the same elements in the first, third and twelfth embodiments are identified by the same reference designations and their detailed descriptions are omitted.

According to the present embodiment, the same switch circuit SW as in the twelfth embodiment (FIG. 15) is added to the third embodiment (FIG. 4). That is, there are formed, in a wiring area WA, sub-connecting wires SLCW connected to the bit lines BL and /BL of a memory cell array ALY on the left side of the figure, and sub-connecting wires SRCW connected to the bit lines BL and /BL of a memory cell array ALY on the right side of the figure. The other structures in the present embodiment are the same as in the third embodiment.

The present embodiment can provide similar effects to the foregoing first, third and twelfth embodiments.

Figure 17:
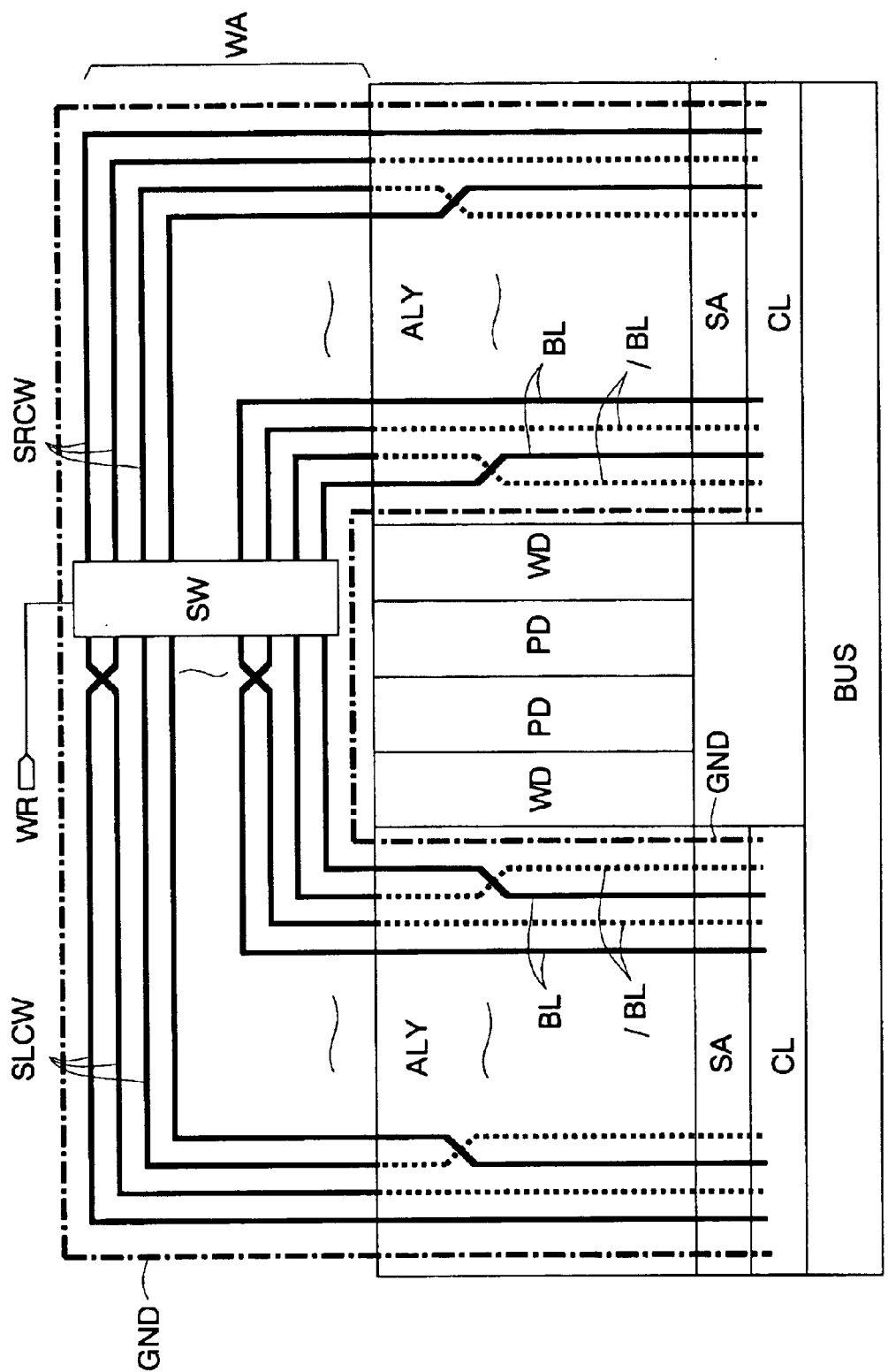
FIG. 17 is a block diagram showing a fourteenth embodiment of the present invention.

FIG. 17 shows a fourteenth embodiment of semiconductor memory according to the present invention. In this fourteenth embodiment, elements corresponding to the same elements in the first, fifth, seventh and twelfth embodiments are identified by the same reference designations and their detailed descriptions are omitted.

According to the present embodiment, the same switch circuit SW as in the twelfth embodiment (FIG. 15) is added to the seventh embodiment (FIG. 10). The other structures in the present embodiment are the same as in the seventh embodiment.

The present embodiment can provide similar effects to the foregoing first, fifth, seventh and twelfth embodiments.

Figure 18:
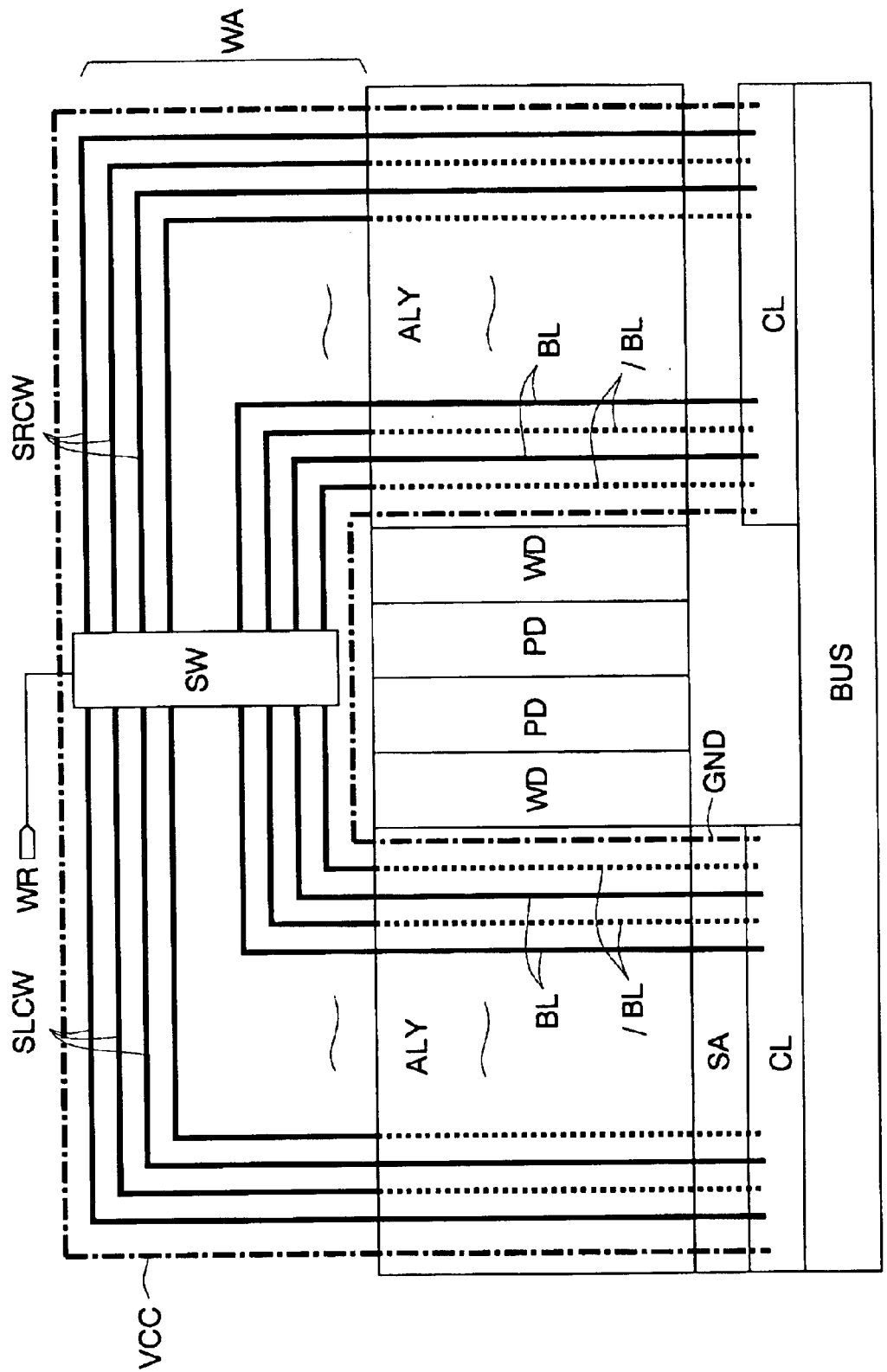
FIG. 18 is a block diagram showing a fifteenth embodiment of the present invention.

FIG. 18 shows a fifteenth embodiment of semiconductor memory according to the present invention. In this fifteenth embodiment, elements corresponding to the same elements in the first, ninth and twelfth embodiments are identified by the same reference designations and their detailed descriptions are omitted.

According to the present embodiment, one of the sense amplifiers SA of the twelfth embodiment (FIG. 15) is removed therefrom. The other structures in the present embodiment are the same as in the twelfth embodiment. In the present embodiment, a sense amplifier SA is formed adjacent to the memory cell array ALY on the left side of the figure. This sense amplifier SA amplifies data only during the read operation. The bit lines of the memory cell arrays ALY are connected to a data bus line BUS via the associated column switches CL.

In the present embodiment, during the read operation when a switch circuit SW is turned on, data read from one of the memory cell arrays ALY is amplified by the sense amplifier SA, and then outputted to the data bus line BUS via the associated column switch CL. During the write operation when the switch circuit SW is turned off, data to be written is supplied via the column switch CL associated with a memory cell array ALY where the write operation is to be executed.

The present embodiment can provide similar effects to the foregoing first, seventh and ninth embodiments.

The foregoing embodiments were described as examples in which the present invention was applied to ferroelectric memories. The present invention, however, is not limited to such embodiments. For example, the present invention may be applied to other types of semiconductor memories having memory cells constituted by variable capacitances.

The invention is not limited to the above embodiments and various modifications may be made without departing from the spirit and scope of the invention. Any improvement may be made in part or all of the components.

What is claimed is:

1. A semiconductor memory comprising:
   a plurality of memory cell arrays operating at different timings from each other, each having memory cells and bit lines for inputting data to and outputting data from said memory cells, said memory cells each being composed of a variable capacitor; and
   connecting wires for directly interconnecting said bit lines between said memory cell arrays, without connecting via an isolation element.

2. The semiconductor memory according to claim 1, wherein said connecting wires are formed using the same wiring layer as said bit lines.

3. The semiconductor memory according to claim 2, wherein said connecting wires are formed in an area adjacent to said memory cell arrays.

4. A semiconductor memory comprising:
   a plurality of memory cell arrays operating at different timings from each other, each having memory cells and bit lines for inputting data to and outputting data from said memory cells, said memory cells each being composed of a variable capacitor; and
   connecting wires for interconnecting said bit lines between said memory cell arrays, wherein
   at least a part of said connecting wires is formed using a wiring layer which is different from a wiring layer of said bit lines.

5. The semiconductor memory according to claim 4, wherein said connecting wires are formed over said memory cell arrays.

6. The semiconductor memory according to claim 1, wherein:
   each pair of said bit lines is a complementary bit line pair; and
   sums of the lengths of said bit lines and the connecting wires are equal to each other in each said bit line pair.

7. A semiconductor memory comprising:
   a plurality of memory cell arrays operating at different timings from each other, each having memory cells and bit lines for inputting data to and outputting data from said memory cells, said memory cells each being composed of a variable capacitor; and
   connecting wires for interconnecting said bit lines between said memory cell arrays, wherein
   at least two of said connecting wires have a first crossing-over part to exchange wiring paths of the connecting wires.

8. The semiconductor memory according to claim 7, wherein:
   each pair of said bit lines is a complementary bit line pair; and
   the connecting wire pairs each having said first crossing-over part are connected to said bit line pairs.

9. A semiconductor memory comprising:
   a plurality of memory cell arrays operating at different timings from each other, each having memory cells and bit lines for inputting data to and outputting data from said memory cells, said memory cells each being composed of a variable capacitor;
   connecting wires for interconnecting said bit lines between said memory cell arrays; and
   a shielding wire which is adjacent to a wiring area where said connecting wires are formed, the shielding wire being supplied a predetermined voltage.

10. The semiconductor memory according to claim 9, wherein said shielding wire is connected to a ground wire.

11. The semiconductor memory according to claim 9, wherein said shielding wire is connected to a power supply line.

12. A semiconductor memory comprising:
   a plurality of memory cell arrays operating at different timings from each other, each having memory cells and bit lines for inputting data to and outputting data from said memory cells, said memory cells each being composed of a variable capacitor;
   connecting wires for interconnecting said bit lines between said memory cell arrays;
   a data bus line for transferring data to said bit lines; and
   a column switch for connecting said data bus line to any one of said bit lines, said column switch being shared by said memory cell arrays.

13. A semiconductor memory comprising:
   a plurality of memory cell arrays operating at different timings from each other, each having memory cells and bit lines for inputting data to and outputting data from said memory cells, said memory cells each being composed of a variable capacitor;
   connecting wires for interconnecting said bit lines between said memory cell arrays; and
   sense amplifiers for amplifying data transferred on said bit lines, respectively, said sense amplifiers being shared by said memory cell arrays.

14. A semiconductor memory comprising:
   a plurality of memory cell arrays operating at different timings from each other, each having memory cells and bit lines for inputting data to and outputting data from said memory cells, said memory cells each being composed of a variable capacitor;
   connecting wires for interconnecting said bit lines between said memory cell arrays;
   a word line for connecting said memory cells to said bit lines; and
   a word driver for supplying a predetermined voltage to said word line, wherein
   said word driver is arranged between said memory cell arrays.

15. A semiconductor memory comprising:
   a plurality of memory cell arrays operating at different timings from each other, each having memory cells and bit lines for inputting data to and outputting data from said memory cells, said memory cells each being composed of a variable capacitor;
   connecting wires for interconnecting said bit lines between said memory cell arrays;
   a plate line connected to said memory cells; and
   a plate driver for supplying a predetermined voltage to said plate line, wherein
   said plate driver is arranged between said memory cell arrays.

16. A semiconductor memory comprising:
   a plurality of memory cell arrays operating at different timings from each other, each having memory cells and bit lines for inputting data to and outputting data from said memory cells, said memory cells each being composed of a variable capacitor; and
   connecting wires for interconnecting said bit lines between said memory cell arrays, wherein:
   each pair of said bit lines is a complementary bit line pair;
   each of said memory cell arrays has second crossing-over parts to exchange wiring paths of the bit lines of said bit line pairs, the second crossing-over parts being formed at every other bit line pair of said bit line pairs; and
   each pair of said connecting wires corresponding to the bit line pairs which do not have said second crossing-over parts formed has a first crossing-over part to exchange wiring paths of the connecting wires.

17. The semiconductor memory according to claim 1, wherein all of said bit lines and all of said connecting wires are wired using a single wiring layer.

18. A semiconductor memory comprising:
   a plurality of memory cell arrays operating at different timings from each other, each having memory cells and bit lines for inputting data to and outputting data from said memory cells, said memory cells each being composed of a variable capacitor; and
   connecting wires for interconnecting said bit lines between said memory cell arrays, wherein
   all of said bit lines and all of said connecting wires are wired using a single wiring layer,
   said connecting wires include sub-connecting wires each connected to said memory cell arrays, and
   said sub-connecting wires are interconnected, respectively, between said memory cell arrays via a switching circuit which turns on during a read operation and turns off during a write operation.

19. A semiconductor memory comprising:

a plurality of memory cell arrays operating at different timings from each other, each having memory cells and bit lines for inputting data to and outputting data from said memory cells, said memory cells each being composed of a variable capacitor; and connecting wires for interconnecting said bit lines between said memory cell arrays, wherein each pair of said bit lines is a complementary bit line pair, sums of the lengths of said bit lines and the connecting wires are equal to each other in each said bit line pair, said connecting wires include sub-connecting wires each connected to said memory cell arrays, and said sub-connecting wires are interconnected, respectively, between said memory cell arrays via a switching circuit which turns on during a read operation and turns off during a write operation.

20. The semiconductor memory according to claim 7, wherein:

said connecting wires include sub-connecting wires each connected to said memory cell arrays; and said sub-connecting wires are interconnected, respectively, between said memory cell arrays via a switching circuit which turns on during a read operation and turns off during a write operation.

21. The semiconductor memory according to claim 9, wherein:

said connecting wires include sub-connecting wires each connected to said memory cell arrays; and said sub-connecting wires are interconnected, respectively, between said memory cell arrays via a switching circuit which turns on during a read operation and turns off during a write operation.

22. The semiconductor memory according to claim 13, wherein:

said connecting wires include sub-connecting wires each connected to said memory cell arrays; and said sub-connecting wires are interconnected, respectively, between said memory cell arrays via a switching circuit which turns on during a read operation and turns off during a write operation.

* * * * *